(12) United States Patent
Fukui et al.

(10) Patent No.: US 9,607,772 B2
(45) Date of Patent: Mar. 28, 2017

(54) POROUS ELECTRODE, DYE-SENSITIZED SOLAR CELL, AND DYE-SENSITIZED SOLAR CELL MODULE

(75) Inventors: Atsushi Fukui, Osaka (JP); Ryohsuke Yamanaka, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 187 days.

(21) Appl. No.: 13/318,296

(22) PCT Filed: Apr. 16, 2010

(86) PCT No.: PCT/JP2010/056818
§ 371 (c)(1),
(2), (4) Date: Oct. 31, 2011

(87) PCT Pub. No.: WO2010/125929
PCT Pub. Date: Nov. 4, 2010

(65) Prior Publication Data
US 2012/0048337 A1    Mar. 1, 2012

(30) Foreign Application Priority Data

Apr. 30, 2009 (JP) .................................. 2009-110839

(51) Int. Cl.
*H01G 9/20*     (2006.01)
*H01M 14/00*    (2006.01)
(Continued)

(52) U.S. Cl.
CPC ........... *H01G 9/2031* (2013.01); *H01G 9/209* (2013.01); *H01M 4/8657* (2013.01);
(Continued)

(58) Field of Classification Search
CPC .......................................... H01G 9/20–9/2095
(Continued)

(56) References Cited

U.S. PATENT DOCUMENTS

| 4,927,721 A | 5/1990 | Gratzel et al. |
| 5,084,365 A | 1/1992 | Gratzel et al. |

(Continued)

FOREIGN PATENT DOCUMENTS

| DE | 10249246 A1 * | 5/2004 |
| EP | 1976051 A1 * | 10/2008 |

(Continued)

OTHER PUBLICATIONS

Machine translation of JP2008-016351A.*
(Continued)

*Primary Examiner* — Eric R Smith
(74) *Attorney, Agent, or Firm* — Nixon & Vanderhye, P.C.

(57) ABSTRACT

A porous electrode of the present invention is a porous electrode in which at least a first porous layer, an intermediate layer and a second porous layer are stacked on a substrate in this order, characterized in that the first porous layer and the second porous layer are formed of particles of the same material, and the first porous layer and the intermediate layer are formed of particles of different materials from each other. Preferably, the average particle diameter of the particles constituting the first porous layer differ in average particle diameter from the particles constituting the second porous layer.

13 Claims, 5 Drawing Sheets

(51) Int. Cl.
*H01M 4/86* (2006.01)
*H01L 51/00* (2006.01)

(52) U.S. Cl.
CPC ......... *H01G 9/2059* (2013.01); *H01G 9/2081* (2013.01); *H01L 51/0086* (2013.01); *H01M 14/005* (2013.01); *Y02E 10/542* (2013.01)

(58) Field of Classification Search
USPC ........................................................ 136/263
See application file for complete search history.

(56) References Cited

U.S. PATENT DOCUMENTS

| | | | | |
|---|---|---|---|---|
| 6,069,313 | A | 5/2000 | Kay | |
| 6,291,763 | B1 * | 9/2001 | Nakamura | 136/256 |
| 2003/0201010 | A1 * | 10/2003 | Koyanagi et al. | 136/263 |
| 2004/0226602 | A1 * | 11/2004 | Durr | H01G 9/2031 |
| | | | | 136/256 |
| 2005/0257826 | A1 * | 11/2005 | Yamanaka et al. | 136/263 |
| 2006/0289057 | A1 * | 12/2006 | Gonda et al. | 136/263 |
| 2007/0024948 | A1 * | 2/2007 | Hirano | G02F 1/15 |
| | | | | 359/265 |
| 2007/0068569 | A1 * | 3/2007 | Nam et al. | 136/255 |
| 2008/0245410 | A1 * | 10/2008 | Duerr et al. | 136/256 |
| 2009/0211638 | A1 * | 8/2009 | Park et al. | 136/262 |
| 2009/0293947 | A1 * | 12/2009 | Higuchi et al. | 136/256 |
| 2010/0024875 | A1 * | 2/2010 | Fukui et al. | 136/256 |
| 2011/0030792 | A1 * | 2/2011 | Miguez et al. | 136/259 |

FOREIGN PATENT DOCUMENTS

| | | | |
|---|---|---|---|
| EP | 2043191 | | 4/2009 |
| JP | 1-220380 | | 9/1989 |
| JP | 11-514787 | | 12/1999 |
| JP | 2001-357897 | | 12/2001 |
| JP | 2002-222968 | | 8/2002 |
| JP | 2002-352868 | | 12/2002 |
| JP | 2002-367686 | | 12/2002 |
| JP | 2003-142171 | | 5/2003 |
| JP | 2003-163037 | | 6/2003 |
| JP | 2006-236960 | | 9/2006 |
| JP | 2008016351 A | * | 1/2008 |
| JP | 2008-115055 | | 5/2008 |
| JP | 2008-147154 | | 6/2008 |
| JP | 2008-173327 | | 7/2008 |
| WO | WO 97/16838 | | 5/1997 |
| WO | WO 2007043533 A1 | * | 4/2007 |
| WO | WO 2008/004556 | | 1/2008 |
| WO | WO 2008139479 A2 | * | 11/2008 |
| WO | WO 2009001343 A2 | * | 12/2008 |
| WO | 2009/127692 | | 10/2009 |

OTHER PUBLICATIONS

Machine translation of DE10249246A1.*
Machine translation of JP2006-236960A.*
International Search Report for PCT/JP2010/056818 mailed Jul. 20, 2010.

* cited by examiner

POROUS ELECTRODE, DYE-SENSITIZED SOLAR CELL, AND DYE-SENSITIZED SOLAR CELL MODULE

This application is the U.S. national phase of International Application No. PCT/JP2010/056818 filed 16 Apr. 2010 which designated the U.S. and claims priority to JP 2009-110839 filed 30 Apr. 2009, the entire contents of each of which are hereby incorporated by reference.

TECHNICAL FIELD

The present invention relates to a porous electrode, a dye-sensitized solar cell and a dye-sensitized solar cell module. In particular, the present invention relates to a porous electrode capable of suppressing stripping between layers as well as a dye-sensitized solar cell and a dye-sensitized solar cell module capable of suppressing a reduction in photoelectric conversion characteristics.

BACKGROUND ART

In recent years, a solar cell directly converting sunlight energy to electrical energy has particularly received attention as a next-generation energy source to replace fossil fuels because the solar cell puts few burden on the global environment. Solar cells in practical use at present mainly include a solar cell using a crystalline silicon substrate and a thin-film silicon solar cell are. In both of these solar cells, efforts are being made to reduce cost per power output by increasing efficiency in photoelectric conversion.

It is difficult, however, to popularize the solar cell using a crystalline silicon substrate because fabrication of the crystalline silicon substrate is expensive. On the other hand, the thin-film silicon solar cell has a problem in that the manufacturing cost is high because many types of gasses for manufacturing the semiconductor and complicated devices must be used in the manufacturing process. Therefore, both of the solar cells have not solved the problem of high manufacturing cost so far.

Therefore, as a different type of solar cell from the aforementioned two types of solar cells, Japanese Patent Laying-Open No. 01-220380 (hereinafter also referred to as "Patent Literature 1") proposes a dye-sensitized solar cell in which photoinduced electron transfer of a metal complex is applied. In this dry-sensitized solar cell, a glass substrate having a porous electrode on a surface thereof and a counter electrode are prepared, and the porous electrode has a light sensitizing dye adsorbed thereon to provide an absorption spectrum in a visible light region.

When this dye-sensitized solar cell is irradiated with light from the transparent electrode side, the light sensitizing dye contained in a photoelectric conversion layer absorbs the light to generate electrons. Then, the generated electrons transfer from one electrode through an external electrical circuit to the opposite electrode. The transferred electrons are carried by ions in an electrolyte to return to the photoelectric conversion layer. By such a series of electron transfer, electrical energy can be continuously extracted from the dye-sensitized solar cell.

The dye-sensitized solar cell disclosed in Patent Literature 1, however, has a structure with the electrolyte injected between the electrodes on the two glass substrates. Therefore, although a prototype of a small-area dye-sensitized solar cell can be made, it is difficult to fabricate a large-area dye-sensitized solar cell such as a dye-sensitized solar cell measuring 1 m per side.

In addition, by increasing the area of one dye-sensitized solar cell, a current obtained from the dye-sensitized solar cell increases in proportion to the area. However, the resistance in the in-plane direction of the transparent electrode also increases, which causes an increase in the internal serial electrical resistance. As a result, a fill factor (FF) in the current-voltage characteristics at the time of photoelectric conversion as well as a short-circuit current decrease, and the photoelectric conversion efficiency deteriorates.

Therefore, as an attempt to solve the problems as described above, a dye-sensitized solar cell has also been proposed in which a plurality of dye-sensitized solar cells are connected in series. In this dye-sensitized solar cell, an electrode (conductive layer) of the dye-sensitized solar cell and an electrode (counter electrode) of an adjacent dye-sensitized solar cell are electrically connected, thereby suppressing an increase in internal serial electrical resistance (refer to, e.g., Japanese Patent National Publication No. 11-514787 (International Publication No. WO97/16838) (hereinafter also referred to as "Patent Literature 2")), Japanese Patent Laying-Open No. 2001-357897 (hereinafter also referred to as "Patent Literature 3"), and Japanese Patent Laying-Open No. 2002-367686 (hereinafter also referred to as "Patent Literature 4")).

CITATION LIST

Patent Literature

PTL 1: Japanese Patent Laying-Open No. 01-220380
PTL 2: Japanese Patent National Publication. No. 11-514787 (International Publication No. WO97/16838)
PTL 3: Japanese Patent Laying-Open No. 2001-357897
PTL 4: Japanese Patent Laying-Open No. 2002-367686

SUMMARY OF INVENTION

Technical Problem

The porous electrode configured by stacking a plurality of layers formed of particles is used as a negative electrode in a photocatalyst, and is used as both positive and negative electrodes in a fuel cell. When such porous electrode is formed of particles made of the same material and having the same particle diameter in order to obtain a single function, the configuration of the porous electrode never raises a problem.

However, when a plurality of layers formed of particles made of different materials and having different particle diameters from one another are stacked in order to obtain a plurality of functions (e.g., light absorption, light scattering, smooth transfer of a liquid and the particles in the porous material, and the like), weak adhesion force between the layers formed of particles made of different materials and having different particle diameters from one another results in stripping between the respective layers.

Particularly when two or more layers of materials having different functions from each other are stacked on the substrate and when particles constituting a layer formed on the substrate side are larger in particle diameter than particles constituting a layer formed thereon, stripping is likely to occur at the interface between these layers.

FIG. 4 is a schematic cross-sectional view showing an example of a conventional dye-sensitized solar cell. As shown in FIG. 4, a conventional dye-sensitized solar cell 110 is formed by stacking a transparent conductive layer 102, a first porous layer 106 having a sensitizing dye adsorbed thereon, a porous insulating layer 104, a catalytic layer 103, a conductive layer 105, and a cover member 109 on a glass substrate 101 in this order (hereinafter, these stacked components will be referred to as a "stacked body"), sealing the periphery of the stacked body with a sealing member 108, and filling the stacked body with an electrolyte.

It is to be noted that, of the front and rear surfaces of dye-sensitized solar cell 110 shown in FIG. 4, a surface through which light in the direction indicated by an arrow 130 is taken in will be called a "light receiving surface."

Conventional dye-sensitized solar cell 110 has been designed such that the particle diameter of particles constituting first porous layer 106 gradually increases from the light receiving surface side toward the non-light receiving surface side of first porous layer 106, thereby enhancing the light confining efficiency within dye-sensitized solar cell 110.

In addition, the conventional dye-sensitized solar cell has also been designed such that a reflective layer (not shown) formed of particles having a particle diameter more than or equal to 100 nm is formed on the non-light receiving surface side of first porous layer 106, so that light incident from the light receiving surface side is reflected into the dye-sensitized solar cell (in particular, into first porous layer 106).

As described above, porous insulating layer 104 is stacked on the non-light receiving surface side of the reflective layer of the conventional dye-sensitized solar cell. However, due to the difference in material between porous insulating layer 104 and the reflective layer, stripping is likely to occur at the interface between porous insulating layer 104 and the reflective layer. Moreover, since the reflective layer is formed of particles having a relatively large particle diameter more than or equal to 100 nm, falling of the particles is likely to occur within the reflective layer. The above-described stripping at the interface between porous insulating layer 104 and the reflective layer and/or the falling of the particles constituting the reflective layer cause a reduction in photoelectric conversion characteristics of the dye-sensitized solar cell.

The present invention was made in view of the above-described circumstances. By changing the order of stacking layers in a porous electrode formed of particles, a porous electrode being less likely to cause stripping among the respective layers and having a desired function can be fabricated. In addition, an object of the present invention is to provide a dye-sensitized solar cell capable of suppressing a reduction in photoelectric conversion characteristics by changing the order of stacking layers in the dye-sensitized solar cell, and a dye-sensitized solar cell module including the dye-sensitized solar cell.

Solution to Problem

A porous electrode according to the present invention is characterized in that a first porous layer, an intermediate layer and a second porous layer are stacked on a substrate in this order, the first porous layer and the second porous layer being formed of particles of the same material, and the first porous layer and the intermediate layer being formed of particles of different materials from each other. Here, preferably, the particles constituting the first porous layer are different in average particle diameter from the particles constituting the second porous layer.

Preferably, the particles constituting the second porous layer are larger in average particle diameter than the particles constituting the intermediate layer.

Preferably, the particles are made of metal oxide.

Preferably, the particles constituting the second porous layer have an average particle diameter more than or equal to 100 nm and less than or equal to 500 nm.

The present invention is also directed to a dye-sensitized solar cell including a conductive substrate, and on the conductive substrate, a first porous layer having at least a sensitizing dye adsorbed thereon and containing an electrolyte therein, an intermediate layer containing the electrolyte therein and made of a material different from a material of the first porous layer, a second porous layer containing the electrolyte therein and formed of particles of the same material as the first porous layer, and a conductive layer, in this order.

Preferably, the intermediate layer is a porous insulating layer provided to electrically insulate the first porous layer from a catalytic layer.

Moreover, preferably, both of the first porous layer and the second porous layer are made of titanium oxide, and the porous insulating layer is formed of one or more metal oxides selected from the group consisting of zirconium oxide, silicon oxide and aluminum oxide, or a mixture containing one or more of the metal oxides.

Preferably, the conductive layer is made of a metal material or a metal oxide material.

Preferably, the metal material contains one or more materials selected from the group consisting of titanium, nickel and tantalum.

Preferably, the metal oxide material contains one or more materials selected from the group consisting of indium tin composite oxide (ITO), tin oxide ($SnO_2$), fluorine-doped tin oxide (FTO), zinc oxide (ZnO), and indium oxide.

The present invention is also directed to a dye-sensitized solar cell module, wherein two or more dye-sensitized solar cells described above are formed on the same conductive substrate, and the conductive layer of one dye-sensitized solar cell of adjacent dye-sensitized solar cells is brought into contact with the conductive substrate of the other dye-sensitized solar cell, thereby electrically connecting the adjacent dye-sensitized solar cells in series.

Advantageous Effects of Invention

According to the present invention, by forming layers of particles made of different materials from each other but having a small particle diameter, and then forming a layer of particles having a large particle diameter, the porous electrode having desired functions and being less likely to cause stripping among the respective layers can be fabricated.

In addition, according to the present invention, by stacking the second porous layer on the porous insulating layer, stripping at the interface between the first porous layer and the porous insulating layer can be suppressed, so that a reduction in photoelectric conversion characteristics can be suppressed.

DESCRIPTION OF EMBODIMENTS

First Embodiment

Figure 1:
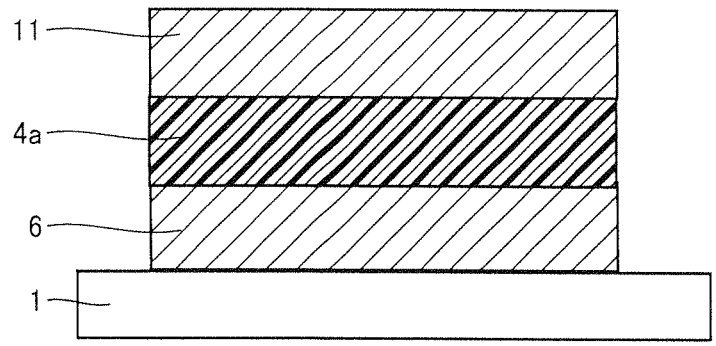
FIG. 1 is a schematic cross-sectional view showing an example of a structure of a porous electrode according to the present invention.

FIG. 1 is a schematic cross-sectional view showing an example of a porous electrode according to the present embodiment. Each component of the porous electrode shown in FIG. 1 are not necessarily drawn on an absolute or relative scale, and FIG. 1 is a schematic view.

<Porous Electrode>

As shown in FIG. 1, the porous electrode according to the present embodiment is a porous electrode in which at least a first porous layer 6, an intermediate layer 4a and a second porous layer 11 are stacked on a substrate 1 in this order, first porous layer 6 and second porous layer 11 being formed of particles of the same material, first porous layer 6 and intermediate layer 4a being formed of particles of different materials from each other.

Preferably, the particles constituting first porous layer 6 are different in average particle diameter from the particles constituting second porous layer 11. Here, more preferably, the particles constituting second porous layer 11 are larger in average particle diameter than the particles constituting the intermediate layer. Further preferably, the particles constituting intermediate layer 4a have an average particle diameter more than or equal to 100 nm.

(1) Substrate

In the porous electrode according to the present embodiment, substrate 1 should only support the porous electrode, and may or may not have conductivity. A substrate having heat resistance is preferably used when firing is performed at the time of film formation. Such substrate 1 having heat resistance can include a substrate made of glass such as soda-lime float glass or silica glass, ceramic or the like.

In addition, substrate 1 is not particularly limited in thickness, and can have any thickness that can support the porous electrode. Preferably, however, substrate 1 has a thickness of 0.5 to 8 mm. If substrate 1 has a thickness less than 0.5 mm, substrate 1 may become distorted when the porous electrode is formed on substrate 1. If substrate 1 has a thickness exceeding 8 mm, the porous electrode increases in size. Therefore, thicknesses less than 0.5 mm and exceeding 8 mm are not preferable.

(Substrate Conductive Layer)

Preferably, a substrate conductive layer is formed to cover a surface of substrate 1 when substrate 1 is required to have conductivity and translucency. The material of such a substrate conductive layer is not particularly limited, and any material that has translucency and conductivity can be used. Preferably, such a material contains one or more materials selected from the group consisting of, for example, indium tin composite oxide (ITO), tin oxide ($SnO_2$), fluorine-doped tin oxide (FTO), zinc oxide (ZnO), and indium oxide, and more preferably made of these materials.

In addition, the substrate conductive layer preferably has a thickness of 0.02 to 5 μm. If the substrate conductive layer has a thickness less than 0.02 μm, the resistance value increases extremely. If the substrate conductive layer has a thickness exceeding 5 μm, the transmittance decreases extremely.

The above-described substrate conductive layer can be formed by a conventionally well-known method, and can be formed on substrate 1 using, for example, a sputtering method, a spray method or the like. Such a commercially available conductive substrate that a substrate conductive layer made of FTO is formed on substrate 1 made of soda-lime float glass may also be used.

(2) First Porous Layer

First porous layer 6 constituting the porous electrode according to the present embodiment is porous and is formed of particles. The material of first porous layer 6 is not particularly limited, and any material that is generally used for the porous electrode can be used. Such a material can include, for example, a metal oxide such as titanium oxide, zinc oxide, tin oxide, iron oxide, niobium oxide, cerium oxide, and tungsten oxide, a precious metal such as gold, silver and copper, a material having a high catalytic ability such as platinum and carbon, and a combination of two or more of these materials. A metal oxide is more preferably used.

First porous layer 6 is not limited to one formed of a single layer, but may be formed of a plurality of layers. First porous layer 6 can be formed of a plurality of layers by repeating two or more times a step of applying a suspension of particles and then performing at least one of drying and firing. Whether a single layer or a plurality of layers, the thickness of first porous layer 6 is not particularly limited, and is preferably 0.1 to 100 μm.

(Method for Forming First Porous Layer)

In the porous electrode according to the present embodiment, a method for forming first porous layer 6 on substrate 1 is not particularly limited, and any method can be used. For example, a method of suspending particles in an appropriate solvent to obtain a suspension, applying the suspension onto substrate 1, and performing at least one of drying and firing is preferably used.

Any conventionally well-known method can be used as a method of applying the above-described suspension. For example, a doctor blade method, a squeegee method, a spin coat method, a screen printing method or the like can be used.

In addition, the solvent used to obtain the above-described suspension can include a glyme-based solvent such as ethylene glycol monomethyl ether, alcohols such as isopropyl alcohol, an alcohol-based mixed solvent such as isopropyl alcohol/toluene, water, and the like. A commercially available paste may also be used instead of the suspension obtained by dispersing particles in the solvent.

The temperature, time, atmosphere, and the like of above-described drying and firing may be set as appropriate depending on the material used for substrate 1 and the type of particles for forming first porous layer 6. In such drying and firing, drying may be performed at a single temperature, or drying may be performed at two or more times may be performed at different temperatures. The temperature for such drying is preferably 50 to 400° C., for example.

In addition, the time of drying and firing is preferably 10 seconds to 12 hours, and drying and firing are preferably performed in the atmosphere or in the atmosphere of an inert gas.

(3) Second Porous Layer

The porous electrode according to the present embodiment is characterized by forming, on first porous layer 6, intermediate layer 4a formed of particles made of a material different from the material of the particles constituting first porous layer 6, and then, forming second porous layer 11 on intermediate layer 4a. By stacking second porous layer 11 in this manner, stripping at the interface between first porous layer 6 and intermediate layer 4a can be prevented.

Substantially the same material is preferably used for the particles constituting second porous layer 11 and the particles constituting first porous layer 6. Herein, "the same material" includes any materials that can be expressed by the same compositional formula, and materials shall be regarded as the same material even if they differ in crystal state, crystal structure and shape.

Since first porous layer 6 and second porous layer 11 are made of the same material as described above, a porous electrode being less likely to cause stripping while keeping light absorption, light reflection and functions within the porous material, which are required of a conventional structure and are optically, physically and chemically preferable, can be fabricated.

Herein, "substantially the same material" is not limited only to an atomic ratio expressed by a single compositional formula, but any ratios deviating from the stoichiometric proportion of the atomic ratio expressed by a single compositional formula do not depart from the scope of the present invention. In the case of titanium oxide ($TiO_2$), for example, the atomic ratio between Ti and O is not limited only to 1:2, but the atomic ratio of oxygen may increase or decrease slightly.

Specifically, when titanium oxide is used for first porous layer 6, titanium oxide is preferably used for second porous layer 11 as well. In addition, even if the material constituting first porous layer 6 and the material constituting second porous layer 11 are compounds having the same stoichiometric proportion, they may differ in crystal structure. However, these compounds are regarded as the same material even if they differ in crystal structure. In other words, for example, when titanium oxide having an anatase-type crystal structure is used as the material of the particles constituting the first porous layer, use of titanium oxide having a rutile-type crystal structure as the material constituting the second porous layer does not depart from the scope the present invention.

Moreover, second porous layer 11 is preferably a layer formed of particles similarly to first porous layer 6, and such particles preferably have a particle diameter more than or equal to 100 nm.

(Method for Forming Second Porous Layer)

As a method for forming second porous layer 11 on intermediate layer 4a, a suspension with particles dispersed in a solvent is preferably applied similarly to first porous layer 6. The solvent used for such a suspension can include a glyme-based solvent such as ethylene glycol monomethyl ether, alcohols such as isopropyl alcohol, an alcohol-based mixed solvent such as isopropyl alcohol/toluene, water, and the like. A commercially available paste may also be used instead of the suspension obtained by dispersing particles in the solvent.

In addition, the method of applying the suspension at the time of forming second porous layer 11 and the conditions at that time (temperature, time, atmosphere, etc.) are preferably the same as those at the time of forming first porous layer 6. The thickness of second porous layer 11 can be of the same level as that of first porous layer 6.

(4) Intermediate Layer

Intermediate layer 4a constituting the porous electrode according to the present embodiment is a layer formed between first porous layer 6 and second porous layer 11, and is characterized in that the material of the particles constituting intermediate layer 4a is different from the material of the particles constituting first porous layer 6. Since the material of the particles constituting intermediate layer 4a is different from the material of the particles constituting first porous layer 6 as described above, the functions such as electric insulation, light scattering, light absorption, and the like can be added to the porous electrode.

This intermediate layer 4a is preferably formed by making particles into a layer. The average particle diameter of the particles constituting intermediate layer 4a is preferably smaller than the average particle diameter of the particles constituting second porous layer 11, more preferably 5 to 400 nm, and further preferably 10 to 100 nm.

The particles constituting intermediate layer 4a are preferably made of, for example, one or more metal oxides selected from the group consisting of zirconium oxide, niobium oxide, silicon oxide (silica glass, soda glass), aluminum oxide, and barium titanate, or a mixture containing one or more of the metal oxides.

Above-mentioned intermediate layer 4a can be formed by a method similar to the above-described method for forming first porous layer 6. In other words, the particles for forming intermediate layer 4a are dispersed in an appropriate solvent, and a polymer compound such as ethyl cellulose or polyethylene glycol (PEG) is further mixed therewith to obtain a paste. The obtained paste is then applied onto first porous layer 6, and drying and firing are performed. Intermediate layer 4a is thus obtained.

An embodiment of a dye-sensitized solar cell according to the present invention will be described below with reference to the drawings. It is to be noted that the present invention is not limited to the embodiment as described below but may be modified as appropriate into various embodiments.

Second Embodiment

Figure 2:
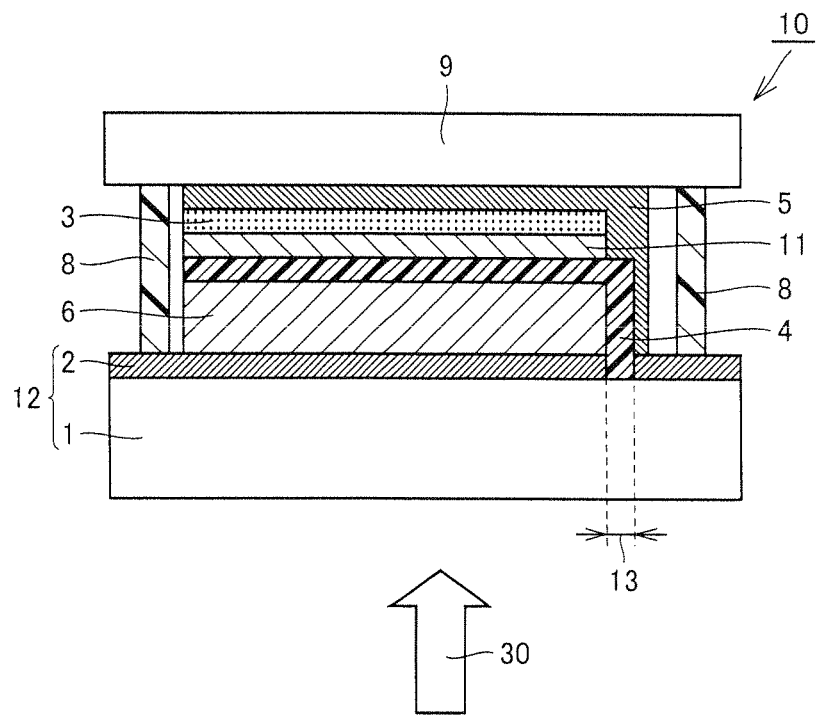
FIG. 2 is a schematic cross-sectional view showing an example of a structure of a dye-sensitized solar cell according to the present invention.
Figure 3:
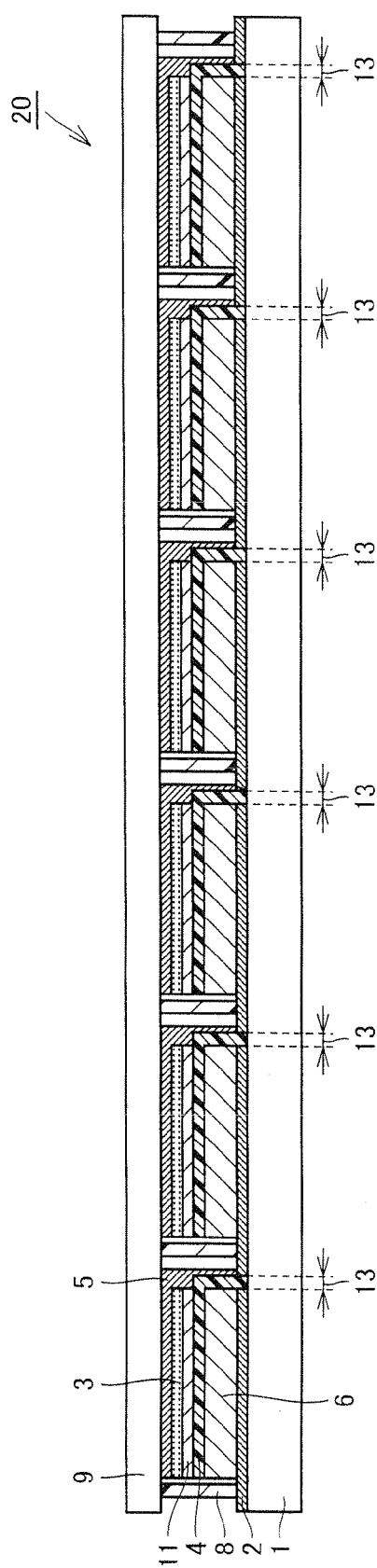
FIG. 3 is a schematic cross-sectional view showing a dye-sensitized solar cell module in which six dye-sensitized solar cells according to the present invention are electrically connected in series.
Figure 4:
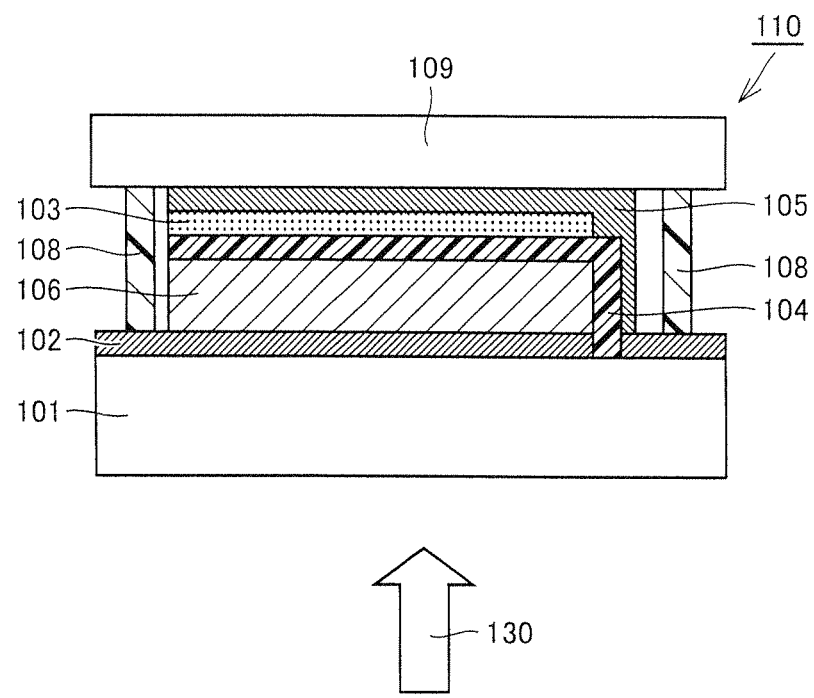
FIG. 4 is a schematic cross-sectional view showing a structure of a conventional dye-sensitized solar cell.
Figure 5:
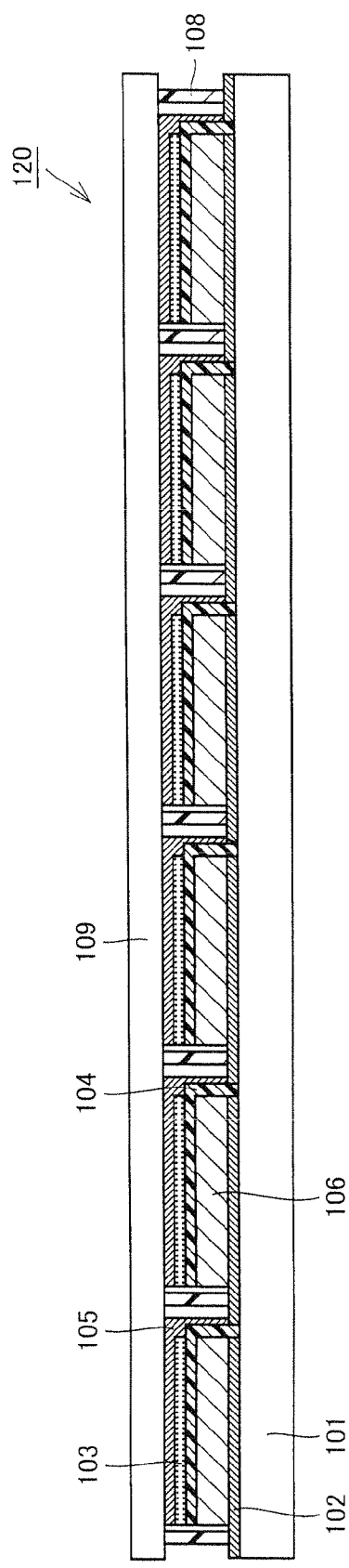
FIG. 5 is a schematic cross-sectional view showing a structure of a dye-sensitized solar cell module in which six conventional dye-sensitized solar cells are electrically connected in series.

FIG. 2 is a schematic cross-sectional view showing an example of a dye-sensitized solar cell according to the present invention. It is to be noted that each component of the dye-sensitized solar cell shown in FIG. 2 is not necessarily drawn on an absolute or relative scale, and FIG. 2 is a schematic view. FIGS. 3 to 5 to be described below are also schematic cross-sectional views and do not accurately show actual dimensions of each component.

<Dye-sensitized Solar Cell>

As shown in FIG. 2, a dye-sensitized solar cell 10 according to the present embodiment is characterized by including a conductive substrate 12 having substrate 1 and a substrate conductive layer 2, and on conductive substrate 12, a first porous layer 6 having a sensitized dye adsorbed thereon and containing an electrolyte therein, an intermediate layer containing the electrolyte therein and made of a material different from that of the first porous layer, a second porous layer 11 containing the electrolyte therein and formed of particles of the same material as the first porous layer, and a conductive layer 5, in this order, and first porous layer 6 and second porous layer 11 are made of substantially the same material. It is to be noted that the intermediate layer in the dye-sensitized solar cell functions as a "porous insulating layer." In other words, dye-sensitized solar cell 10 according to the present embodiment is characterized in that second porous layer 11 is formed on the non-light receiving surface side of porous insulating layer 4.

By forming second porous layer 11 on the non-light receiving surface side of porous insulating layer 4 in this manner, the light absorption efficiency can be improved, and the stacking strength between first porous layer 6 and porous insulating layer 4 can be improved.

FIG. 2 shows dye-sensitized solar cell 10 in which substrate 1, substrate conductive layer 2, first porous layer 6, porous insulating layer 4, second porous layer 11, catalytic layer 3, conductive layer 5, and translucent cover member 9 are sequentially formed in this order, and sealing member 8 is provided at the outer peripheral portion between substrate conductive layer 2 and translucent cover member 9. The structure of the dye-sensitized solar cell is not limited to the structure of dye-sensitized solar cell 10 shown in FIG. 1, and the order of stacking catalytic layer 3 and conductive layer 5 may be reversed.

In addition, substrate conductive layer 2 has a scribe line 13, part of which has been removed to a surface of substrate 1, in an inner region near sealing member 8. Substrate conductive layer 2 is divided into a wide section serving as a region where a solar cell will be formed (left-hand section of substrate conductive layer 2 in FIG. 2) and a narrow section (right-hand section of substrate conductive layer 2 in FIG. 2) with scribe line 13 interposed therebetween. A portion of the wide section of substrate conductive layer 2 exposed in an outer region of sealing member 8 and a portion of the narrow section of substrate conductive layer 2 exposed in the outer region of sealing member 8 will be both electrically connected to an external circuit.

In addition, porous insulating layer 4 is formed from over first porous layer 6 to over a bottom surface of scribe line 13 (i.e., on the surface of substrate 1). On the other hand, conductive layer 5 is formed from above porous insulating layer 4 to over the narrow section of substrate conductive layer 2. The narrow section of substrate conductive layer 2 electrically connected to conductive layer 5 serves as an extractor electrode for conductive layer 5.

In addition, above-described second porous layer 11 is preferably formed of particles having an average particle diameter more than or equal to 100 nm. By using such particles to form second porous layer 11, external light incident from the light receiving surface of the dye-sensitized solar cell can be reflected off second porous layer 11, so that the light absorption efficiency of dye-sensitized solar cell 10 can be improved. Moreover, since second porous layer 11 is provided in this manner, it is not necessary to provide a reflective layer between first porous layer 6 and porous insulating layer 4, so that stripping of first porous layer 6 and porous insulating layer 4 can also be suppressed.

It is to be noted that dye-sensitized solar cell 10 shown in FIG. 2 is configured to take in light in the direction indicated by an arrow 30. A surface of dye-sensitized solar cell 10 through which light is taken in will be particularly called a "light receiving surface", and a surface of dye-sensitized solar cell 10 opposite to the light receiving surface will be called a "non-light receiving surface."

Each component used in the dye-sensitized solar cell according to the present embodiment will now be described.

(1) Conductive Substrate

Conductive substrate 12 constituting dye-sensitized solar cell 10 according to the present embodiment is configured by forming substrate conductive layer 2 on the surface of substrate 1. Substrate 1 and substrate conductive layer 2 constituting conductive substrate 12 will be described below.

(Substrate)

Substrate 1 included in above-described conductive substrate 12 is not particularly limited, and any substrate that can support the dye-sensitized solar cell can be used. Substrate 1 having heat resistance is preferably used when firing is performed at the time of film formation. Such substrate 1 having heat resistance can include a substrate made of glass such as soda-lime float glass or silica glass, ceramic or the like.

In addition, substrate 1 can have any thickness that can support the dye-sensitized solar cell. Preferably, however, substrate 1 has a thickness of 0.5 to 8 mm. If substrate 1 has a thickness less than 0.5 mm, substrate 1 may become distorted when dye-sensitized solar cell 10 is formed on substrate 1. If substrate 1 has a thickness exceeding 8 mm, the dye-sensitized solar cell increases in size. Therefore, thicknesses less than 0.5 mm and exceeding 8 mm are not preferable.

(Substrate Conductive Layer)

A material of substrate conductive layer 2 included in above-described conductive substrate 12 is not particularly limited, and any material that has translucency and conductivity can be used. Preferably, such a material contains one or more materials selected from the group consisting of for example, indium tin composite oxide (ITO), tin oxide ($SnO_2$), fluorine-doped tin oxide (FTO), zinc oxide (ZnO), and indium oxide, and more preferably made of these materials.

In addition, substrate conductive layer 2 preferably has a thickness of 0.02 to 5 μm. If substrate conductive layer 2 has a thickness less than 0.02 μm, the resistance value of substrate conductive layer 2 increases extremely. If substrate conductive layer 2 has a thickness exceeding 5 μm, the transmittance of substrate conductive layer 2 decreases extremely.

In addition, from the viewpoint of suppressing a voltage drop in the dye-sensitized solar cell, a lower film resistance of substrate conductive layer 2 is preferable, and a resistance less than or equal to 40 Ω/sq is particularly preferable. If substrate conductive layer 2 has a film resistance exceeding 40 Ω/sq, a voltage drop in the dye-sensitized solar cell increases, which is not preferable.

Above-described substrate conductive layer 2 can be formed by a conventionally well-known method, and can be formed on substrate 1 using, for example, a sputtering method, a spray method or the like. Such commercially available conductive substrate 12 that substrate conductive layer 2 made of FTO is formed on substrate 1 made of soda-lime float glass may also be used.

(2) First Porous Layer

First porous layer 6 constituting dye-sensitized solar cell 10 according to the present embodiment is porous and is formed of particles. First porous layer 6 has a sensitized dye adsorbed thereon and contains an electrolyte therein.

This first porous layer 6 preferably contains the sensitized dye in a concentration more than or equal to $1 \times 10^{-8}$ mol/cm$^2$ and less than or equal to $1 \times 10^{-6}$ mol/cm$^2$ per unit area, more preferably in a concentration more than or equal to $5 \times 10^{-8}$ mol/cm$^2$ and less than or equal to $5 \times 10^{-7}$ mol/cm$^2$, and further preferably more than or equal to $8 \times 10^{-8}$ mol/cm$^2$ and less than or equal to $3 \times 10^{-7}$ mol/cm$^2$. If first porous layer 6 contains the sensitized dye in a concentration less than $1 \times 10^{-8}$ mol/cm$^2$, a generated current decreases. If the concentration exceeds $1 \times 10^{-6}$ mol/cm$^2$, dye molecules adsorb one upon another, and electrons are less likely to be injected into the porous layer even though light is absorbed therein.

The material of this first porous layer 6 is not particularly limited, and any material that is generally used in the field of photoelectric conversion materials can be used. Such a material can include, for example, a semiconductor compound such as titanium oxide, zinc oxide, tin oxide, iron oxide, niobium oxide, cerium oxide, tungsten oxide, barium titanate, strontium titanate, cadmium sulfide, lead sulfide, zinc sulfide, indium phosphide, copper-indium sulfide ($CuInS_2$), $CuAlO_2$, $SrCu_2O_2$, and a combination of two or more of these semiconductor compounds. Among these materials, titanium oxide is preferably used because of its excellent stability and safety.

In addition, the crystal structure of titanium oxide when used as the material constituting first porous layer 6 includes various types of narrowly-defined titanium oxide such as anatase-type titanium oxide, rutile-type titanium oxide, amorphous titanium oxide, metatitanic acid, and orthotitanic acid, as well as titanium hydroxide, aqueous titanium oxide and the like, and these titanium oxides can be used alone or a mixture of two or more of them can be used.

Either of the two types of crystal structures, that is, the anatase-type crystal structure and the rutile-type crystal structure, may be adopted as the crystal structure of titanium oxide described above. From the viewpoint of enhancing the dye sensitivity of first porous layer 6, however, titanium oxide having a high content of the anatase-type crystal structure is more preferably used, and titanium oxide having more than or equal to 80% of the anatase-type crystal structure is further preferably used. It is to be noted that the crystal structure of titanium oxide can become either the anatase-type crystal structure or the rutile type crystal structure by adjusting the production method and the heat history as appropriate.

Although the crystal state of the material constituting first porous layer 6 can be either monocrystalline or polycrystalline, the polycrystalline state is preferably used. In addition, from the viewpoint of ensuring a high degree of compatibility among light scattering, stability, difficulty in crystal growth, manufacturing cost and the like, the material constituting this first porous layer 6 preferably has the form of particles, and the particles more preferably have a particle diameter of several nanometers to several thousands micrometers.

Titanium oxide particles can be produced by known methods described in various items of literature, such as a vapor phase method or a liquid phase method (a hydrothermal synthesis method, a sulfuric acid method). Alternatively, the titanium oxide particles may be produced by a method developed by Degussa AG of hydrolyzing chloride at a high temperature.

The particles constituting first porous layer 6 are not limited to a semiconductor compound made of the same material as that of the particles constituting second porous layer 11, but semiconductor compounds made of different materials from each other may be used in mixture. In addition, the particles constituting first porous layer 6 are not limited to particles each having the same particle diameter, but two or more types of particles having different particle diameters from each other may be used in mixture. By using such particles having different particle diameters from each other, the capture rate can be improved because the particles larger in particle diameter scatter light, and the amount of dye adsorption can be improved because the particles smaller in particle diameter increase the number of adsorption sites.

Such particles larger in particle diameter preferably have an average particle diameter of 100 to 500 nm, and the particles smaller in particle diameter preferably have an average particle diameter of 5 nm to 50 nm. In addition, the average particle diameter of the particles larger in particle diameter is more preferably three times as large as the average particle diameter of the particles smaller in particle diameter.

From the viewpoint of causing the sensitized dye to be efficiently adsorbed, the particles constituting first porous layer 6 preferably have a large surface area, and preferably have a surface area of 10 to 200 $m^2/g$. If the particles have a surface area less than 10 $m^2/g$, the sensitized dye may not sufficiently adsorb thereon. If the particles have a surface area exceeding 200 $m^2/g$, pores become smaller, so that the dye may not adsorb therein or the electrolytic solution may not be contained therein.

In addition, when the particles constituting first porous layer 6 have different particle diameters and also when the particles are made of different materials, semiconductor compound particles (hereinafter, also simply referred to as "semiconductor particles") exerting a strong adsorption effect are preferably used as the material used for the particles smaller in particle diameter.

First porous layer 6 is not limited to one that is formed of a single layer but may be formed of a plurality of layers. First porous layer 6 can be formed of a plurality of layers by repeating two or more times a step of preparing and applying a suspension of particles having different particle diameters, and then performing at least one of drying and firing. This first porous layer 6 may be formed of either a single layer or a plurality of layers. Whether a single layer or a plurality of layers, the thickness of first porous layer 6 is not particularly limited, and is preferably 0.1 to 100 μm.

(Method for Forming First Porous Layer)

In the dye-sensitized solar cell according to the present embodiment, a method for forming first porous layer 6 on substrate conductive layer 2 is not particularly limited, and any method can be used. For example, first porous layer 6 can be formed by suspending particles in an appropriate solvent to obtain a suspension, applying the suspension on substrate conductive layer 2, and performing at least one of drying and firing.

Any conventionally well-known method can be used as a method of applying the above-described suspension. For example, a doctor blade method, a squeegee method, a spin coat method, a screen printing method or the like can be used.

In addition, the solvent used to obtain the above-described suspension can include a glyme-based solvent such as ethylene glycol monomethyl ether, alcohols such as isopropyl alcohol, an alcohol-based mixed solvent such as isopropyl alcohol/toluene, water, and the like. A commercially available titanium oxide paste (product name: Ti-nanoxide D, T/SP, D/SP (manufactured by Solaronix)) may also be used instead of the suspension obtained by dispersing particles in the solvent.

The temperature, time, atmosphere, and the like of the above-described drying and firing may be set as appropriate depending on the material used for substrate conductive layer 2 and the type of particles for forming first porous layer 6. In such drying and firing, drying may be performed at a single temperature, or drying may be performed at two or more times at different temperatures. The temperature for such drying is preferably 50 to 400° C., for example.

In addition, the time of drying and firing is preferably 10 seconds to 12 hours, and drying and firing are preferably performed in the atmosphere or in the atmosphere of an inert gas.

After forming first porous layer 6 as described above, a treatment with a titanium tetrachloride solution is preferably performed when first porous layer 6 is formed of titanium oxide particles, for the purpose of improving electrical connection among the particles, increasing the surface area of first porous layer 6, and reducing the defect level in the particles.

(Electrolyte)

In the dye-sensitized solar cell of the present embodiment, an electrolyte is contained in first porous layer 6, porous insulating layer 4 and second porous layer 11 and is provided for maintaining the conductivity among these respective layers. Such an electrolyte is not particularly limited, and any electrolyte that is generally used in the field of solar cells can be used, which is a fluid material at least containing a redox species. It is noted that any electrolyte that further contains a solvent and an additive in addition to redox species does not fall outside the scope of the present invention.

The redox species contained in such an electrolyte includes $I^-/I^{3-}$-based, $Br^{2-}/Br^{3-}$-based, $Fe^{2+}/Fe^{3+}$-based, and quinone/hydroquinone-based species, and the like. Specifically, a combination of metal iodide such as lithium iodide (LiI), sodium iodide (NaI), potassium iodide (KI), or calcium iodide ($CaI_2$) with iodine ($I_2$), a combination of tetraalkylammonium salt such as tetraethylammonium iodide (TEAT), tetrapropylammonium iodide (TPAI), tetrabutylammonium iodide (TBAI), or tetrahexylammonium iodide (THAI) with iodine ($I_2$), and a combination of metal bromide such as lithium bromide (LiBr), sodium bromide (NaBr), potassium bromide (KBr), or calcium bromide ($CaBr_2$) with bromine ($Br_2$) are preferably used, and the combination of LiI and $I_2$ is more preferably used.

In addition, the redox species contained in the electrolyte is preferably in a concentration more than or equal to 0.001 mol/l and less than or equal to 1.5 mold, and a range of 0.01 to 0.7 mol/l is more preferable.

Moreover, the solvent contained in the electrolyte can include carbonate compounds such as propylene carbonate, nitrile compounds such as acetonitrile, alcohols such as ethanol, water, aprotic polar substances, and the like. They may be used alone, or two or more of them may be used in mixture. Among these solvents, carbonate compounds and nitrile compounds are preferably used.

An additive may be added to the above-described electrolyte, as described above. The additive added to the electrolyte can include nitrogen-containing aromatic compounds such as t-butylpyridine (TBP), and imidazole salts such as dimethylpropylimidazole iodide (DMPII), methylpropylimidazole iodide (MPII), ethylmethylimidazole iodide (EMIT), ethylimidazole iodide (EII), and hexylmethylimidazole iodide (HMII).

(Sensitized Dye)

As the sensitized dye contained in first porous layer 6, any sensitized dye that functions as a photosensitizer can be used. Among such sensitized dyes, an organic dye, a metal complex dye or the like having absorption regions in a visible light region and an infrared light region is preferably used. These sensitized dyes may be used alone, or two or more of them may be used in combination.

As the above-described organic dye, for example, azo dyes, quinone dyes, quinonimine dyes, quinacridone dyes, squarylium dyes, cyanine dyes, merocyanine dyes, triphenylmethane dyes, xanthene dyes, porphyrin dyes, perylene dyes, indigo dyes, naphthalocyanine dyes, and the like are preferably used.

The above-described metal complex dye includes dyes in the form in which molecules are coordinate-bonded to metal such as, for example, Cu, Ni, Fe, Co, V, Sn, Si, Ti, Ge, Cr, Zn, Ru, Mg, Al, Pb, Mn, In, Mo, Y, Zr, Nb, Sb, La, W, Pt, TA, Ir, Pd, Os, Ga, Tb, Eu, Rb, Bi, Se, As, Sc, Ag, Cd, Hf, Re, Au, Ac, Tc, Te, and Rh. Among these metal complex dyes, phthalocyanine dyes and ruthenium metal complex dyes are preferably used, and ruthenium metal complex dyes are more preferably used.

Particularly, ruthenium metal complex dyes expressed by Formulas (1) to (3) below are particularly preferable, and a Ruthenium535 dye, a Ruthenium535-bisTBA dye, a Ruthenium620-1H3TBA dye (manufactured by Solaronix), and the like as commercially available dyes among these ruthenium metal complex dyes are preferably used.

[Chemical Formula 1]

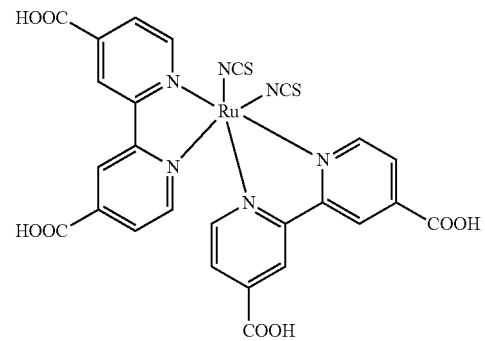

[Chemical Formula 2]

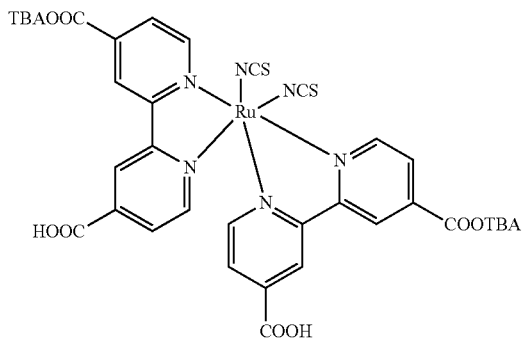

[Chemical Formula 3]

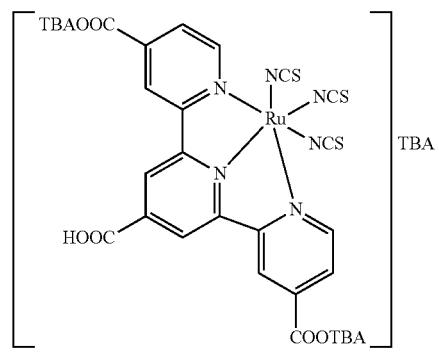

In addition, from the viewpoint of making the sensitized dye more likely to be adsorbed during fabrication of first porous layer 6, a sensitized dye having an interlocking group in molecules of the sensitized dye is preferably used. By using such a sensitized dye having an interlocking group, the interlocking group exists in a contact surface between first porous layer 6 and the sensitized dye, and electric coupling is established between the sensitized dye in an excited state and a conduction band of semiconductor constituting first porous layer 6, which can facilitate electron transfer between first porous layer 6 and the sensitized dye.

Such an interlocking group can include carboxyl groups, alkoxy groups, hydroxyl groups, sulfone groups, ester groups, mercapto groups, phosphonyl groups, and the like. Among these, carboxyl groups, hydroxyl groups, sulfone groups, phosphonyl groups, and the like are preferably used, and carboxyl groups are more preferable.

(Method of Dye Adsorption)

During fabrication of first porous layer 6, as a typical method of causing the sensitized dye to adsorb thereon, for example, a method can be used in which a stacked body obtained by forming first porous layer 6, porous insulating layer 4, catalytic layer 3, and conductive layer 5 on conductive substrate 12 is immersed in a solution in which the sensitized dye has been dissolved (hereinafter simply referred to as a "dye adsorption solution").

As the solvent used for dissolving the sensitized dye in the above-described dye adsorption solution, any solvent that can dissolve the sensitized dye can be used, however, a purified one is preferably used. In addition, the solvent used for the dye adsorption solution is not limited to a single solvent, but two or more solvents may be used in mixture. Such a solvent can include, for example, alcohols such as ethanol, propanol and butanol, toluene, acetonitrile, tetrahydrofuran (THF), chloroform, dimethylformamide, and the like, and a mixed solution of one or more of them may be used.

The concentration of the sensitized dye contained in the dye adsorption solution can be set appropriately depending on the material of the sensitized dye used, the type of solvent, and the conditions of the dye adsorption step and the like, and a concentration more than or equal to $1 \times 10^{-5}$ mol/l, for example, is preferably used.

(3) Second Porous Layer

The dye-sensitized solar cell of the present embodiment is characterized by forming second porous layer 11 on porous insulating layer 4. This second porous layer 11 is a layer provided for reflecting light incident from the light receiving surface of the dye-sensitized solar cell without transmission therethrough. By providing second porous layer 11 in this manner, stripping at the interface between first porous layer 6 and porous insulating layer 4 can be prevented.

Substantially the same material is preferably used for second porous layer 11 and first porous layer 6. Herein, "the same material" includes any materials that can be expressed by the same compositional formula, and materials shall be regarded as the same material even if they differ in crystal state, crystal structure and shape. Since first porous layer 6 and second porous layer 11 are made of the same material as described above, a dye-sensitized solar cell in which optically, physically and chemically preferable materials of a light absorption layer and a light reflecting layer used in a porous electrode of conventional structure can be used and in which stripping does not occur can be fabricated. This can significantly improve the performance of the dye-sensitized solar cell as compared to the conventional stacked structure.

In addition, "substantially" is not limited only to an atomic ratio expressed by a single compositional formula, but means that any ratios deviating from the stoichiometric proportion of the atomic ratio expressed by a single compositional formula do not depart from the scope of the present invention. In the case of titanium oxide ($TiO_2$), for example, the atomic ratio between Ti and O is not limited only to 1:2, but the atomic ratio of oxygen may increase or decrease slightly.

In other words, when titanium oxide is used for first porous layer 6, titanium oxide is preferably used for second porous layer 11 as well. In addition, the anatase-type crystal structure is preferably used as the crystal structure of titanium oxide constituting second porous layer 11 similarly to the first porous layer, and titanium oxide having more than or equal to 80% of the anatase-type crystal structure is more preferably used.

In addition, second porous layer 11 is preferably a layer formed of particles similarly to first porous layer 6, and such particles preferably have a particle diameter more than or equal to 100 nm. By using particles having such a particle diameter, the light absorption efficiency of the dye-sensitized solar cell can be enhanced, and the stacking strength between the first porous layer and the porous insulating layer can be enhanced.

(Method for Forming Second Porous Layer)

As a method for forming second porous layer 11 on porous insulating layer 4, second porous layer 11 is preferably formed by applying a suspension with semiconductor particles dispersed in a solvent similarly to first porous layer 6. The solvent used for such a suspension can include a glyme-based solvent such as ethylene glycol monomethyl ether, alcohols such as isopropyl alcohol, an alcohol-based mixed solvent such as isopropyl alcohol/toluene, water, and the like. A commercially available titanium oxide paste (product name: Ti-nanoxide D, T/SP, D/SP (manufactured by Solaronix)) may also be used instead of the suspension obtained by dispersing particles in the solvent.

In addition, the method of applying the suspension at the time of forming second porous layer 11 and the conditions at that time (temperature, time, atmosphere, etc.) are preferably the same as those at the time of forming first porous layer 6.

The thickness of second porous layer 11 can be of the same level as that of first porous layer 6.

After forming second porous layer 11, a treatment with a titanium tetrachloride solution may be performed when first porous layer 6 and second porous layer 11 are titanium oxide films, for example, for improving electrical connection among the particles and reducing the defect level in the semiconductor particles.

(4) Porous Insulating Layer

Porous insulating layer 4 constituting dye-sensitized solar cell 10 of the present embodiment is a layer formed on the non-light receiving surface side of first porous layer 6, and provided for electrically insulating first porous layer 6 and catalytic layer 3 (or conductive layer 5). Such porous insulating layer 4 is formed from over first porous layer 6 to over the bottom surface of scribe line 13 (the surface of substrate 1).

Such porous insulating layer 4 is preferably formed by making particles into a layer, and the average particle diameter of such particles is preferably 5 to 500 nm, and more preferably 10 to 300 nm.

The particles constituting such porous insulating layer 4 are preferably made of, for example, one or more metal oxides selected from the group consisting of zirconium oxide, niobium oxide, silicon oxide (silica glass, soda glass), aluminum oxide, and barium titanate, or a mixture containing one or more of the metal oxides.

Above-mentioned porous insulating layer 4 can be formed by a method similar to the above-described method for forming first porous layer 6. In other words, the particles for forming porous insulating layer 4 are dispersed in an appropriate solvent, and a polymer compound such as ethyl cellulose or polyethylene glycol (PEG) is further mixed therewith to obtain a paste. Thus obtained paste is applied onto first porous layer 6, and then drying and firing are performed. Porous insulating layer 4 is thus obtained.

(5) Catalytic Layer

Catalytic layer 3 used in dye-sensitized solar cell 10 of the present embodiment is a layer serving to reduce holes in the electrolyte. The material of such catalytic layer 3 is not particularly limited, and any material that is generally used as a photoelectric conversion material in that field can be used. The material of such catalytic layer 3 can include, for example, platinum, carbon black, ketjenblack, carbon nanotube, fullerene, and the like.

When platinum is used for catalytic layer 3, catalytic layer 3 can be formed on substrate conductive layer 2 by a sputtering method, thermal decomposition of chloroplatinic acid, electrodeposition, or the like.

In addition, carbon is preferably used for catalytic layer 3, and such carbon can include carbon black, ketjenblack, carbon nanotube, fullerene, and the like. Catalytic layer 3 can be formed on substrate conductive layer 2 by dispersing the above-described carbon in a solvent to obtain a paste, and then applying that paste by a screen printing method or the like. Moreover, catalytic layer 3 preferably has a thickness of 0.5 to 1000 nm.

The form of catalytic layer 3 is not particularly limited, and can be in any form, which can be dense film-like, porous film-like or cluster-like, for example.

(6) Conductive Layer

In the case of configuring a dye-sensitized solar cell module so as to extract current and voltage to the outside, conductive layer 5 constituting the dye-sensitized solar cell of the present embodiment is a layer provided to be connected in series to a conductive substrate of an adjacent dye-sensitized solar cell.

Such conductive layer 5 is preferably made of a metal material or a metal oxide material. Such a metal material preferably contains one or more materials selected from the group consisting of titanium, nickel and tantalum. When conductive layer 5 is made of a metal oxide material, such a metal oxide material preferably contains one or more materials selected from the group consisting of indium tin composite oxide (ITO), tin oxide ($SnO_2$), fluorine-doped tin oxide (FTO), zinc oxide (ZnO), and indium oxide. Particularly, when titanium oxide is used for the second porous layer, titanium is used for the conductive layer to utilize the binding characteristics between titanium oxide and titanium, so that the bonding strength between second porous layer 11 and conductive layer 5 can be improved.

In addition, conductive layer 5 preferably has a thickness of 0.02 to 5 μm. Moreover, from the viewpoint of suppressing a voltage drop in the dye-sensitized solar cell, a lower film resistance of conductive layer 5 is preferable, and a resistance less than or equal to 40 Ω/sq is particularly preferable.

Above-described conductive layer 5 can be formed on porous insulating layer 4 by a conventionally well-known method using, for example, a sputtering method, a spray method, a deposition method, or the like.

The fill factor of above-described conductive layer 5 may decrease monotonously as the density increases (as the porosity decreases), which may degrade the performance of the dye-sensitized solar cell, as a result of which desired performance of conductive layer 5 may not be obtained.

Therefore, when the density of conductive layer 5 is high as described above, a plurality of pores for allowing the electrolyte to transfer between conductive layer 5 and first porous layer 6 (paths of the electrolyte) are preferably formed in conductive layer 5. These pores can be formed by physical contact or laser machining. The pores preferably have a size of about 0.1 μm to 100 μm, and more preferably about 1 μm to 50 μm. In addition, the spacing between different pores is preferably about 1 μm to 200 μm, and more preferably about 10 μm to 300 μm.

(Translucent Cover Member)

Translucent cover member 9 used in the dye-sensitized solar cell of the present embodiment has translucency, and covers the non-light receiving surface side of catalytic layer 3 or conductive layer 5. As such translucent cover member 9, for example, reinforced glass, a glass plate, a transparent plastic sheet, or the like can be used. When the solar cell is installed outdoors, reinforced glass is preferably used.

(Sealing Member)

Sealing member 8 used for the dye-sensitized solar cell of the present embodiment has the functions of preventing leakage of the electrolyte inside the dye-sensitized solar cell, absorbing stress (shock) and/or shock of a fallen object that would affect substrate 1, and absorbing deflection or the like that would affect a support body during long-term use.

The material constituting such sealing member 8 is not particularly limited, and any material that can be used for a typical dye-sensitized solar cell and that can exert the above-described functions can be used. The material of such sealing member 8 can include ultraviolet curing resin, thermosetting resin and the like, and specifically, silicone resin, epoxy resin, polyisobutylene-based resin, hot melt resin, glass frit, and the like. Two or more of these materials may be used in mixture.

The ultraviolet curing resin used for above-described sealing member 8 can include, for example, Model No.: 31X-101 (manufactured by ThreeBond Co., Ltd.), and the thermosetting resin can include, for example, Model No.: 31X-088 (manufactured by ThreeBond Co., Ltd.). Besides them, a commercially available epoxy resin may be used.

In addition, sealing member 8 made of a material as described above is not limited to a single layer structure, but may be formed by stacking two or more layers.

When sealing member 8 is formed using silicone resin, epoxy resin, glass frit, or the like in dye-sensitized solar cell 10 of the present embodiment, the pattern of sealing member 8 is preferably formed using a dispenser. Alternatively, when sealing member 8 is formed using hot melt resin, sealing member 8 is preferably formed by providing patterned holes in sheet-like hot melt resin.

When a plate of reinforced glass or another glass is used as translucent cover member 9 as described above, sealing member 8 is preferably provided. Further, when fabricating a dye-sensitized solar cell module by connecting two or more dye-sensitized solar cells of the present embodiment in series, sealing member 8 may function as an intercellular insulating layer for preventing transfer of the electrolyte between the dye-sensitized solar cells.

Third Embodiment

FIG. 3 is a schematic cross-sectional view showing a dye-sensitized solar cell module in which six dye-sensitized solar cells according to the present embodiment are disposed.

(Dye-Sensitized Solar Cell Module)

As shown in FIG. 3, the dye-sensitized solar cell module of the present embodiment is characterized by having six dye-sensitized solar cells formed on substrate 1, and characterized in that conductive layer 5 of one dye-sensitized solar cell of adjacent dye-sensitized solar cells is in contact with a conductive substrate of the other dye-sensitized solar cell for serial connection. By thus configuring a dye-sensitized solar cell module 20, an increase in internal serial electrical resistance of the dye-sensitized solar cell module can be suppressed.

The present invention will now be described in more detail referring to examples and comparative examples, however, the present invention is not limited to them. In addition, unless otherwise specified, a value measured by using a surface texture and contour measuring instrument (product name: SURFCOM 1400A (manufactured by Tokyo Seimitsu CO., Ltd.)) was adopted to the thickness of each layer in the examples and comparative examples.

Example 1

Figure 6:
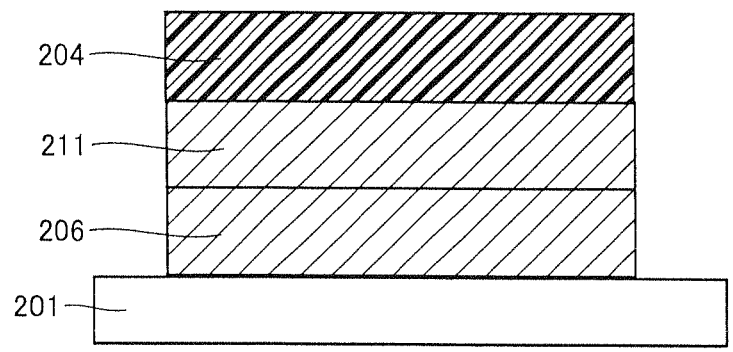
FIG. 6 is a schematic cross-sectional view showing an example of a structure of a conventional porous electrode.

A porous electrode according to Example 1 was fabricated by each step described below. FIG. 1 is a schematic cross-sectional view showing an example of a porous electrode fabricated in accordance with the present example, and FIG. 6 is a schematic cross-sectional view showing an example of a porous electrode fabricated in accordance with a conventional manufacturing method. In the following, ten porous electrodes as shown in FIG. 1 and ten porous electrodes having a conventional structure as shown in FIG. 6 were fabricated, and the light transmittance, the light absorption and the transport resistance of an electrolyte were measured for each porous electrode.

(Formation of First Porous Layer)

Substrate 1 was disposed on a screen printing machine (model: LS-34TVA (manufactured by Newlong Seimitsu Kogyo CO., Ltd.)) including a screen plate having an opening of 5 mm×50 mm, and a titanium oxide paste (product name: Ti-Nanoxide D/SP (manufactured by Solaronix)) with titanium oxide having an average particle diameter of 13 nm dispersed therein was applied onto the surface of substrate 1. This titanium oxide included more than or equal to 90% of the anatase-type crystal structure. This crystal structure was obtained by measurement with an X-ray diffractometer (XRD).

Then, the above-described titanium oxide paste was leveled at a room temperature for one hour, was preliminarily dried at 80° C. for 20 minutes, and was fired at 450° C. for one hour. Each step of applying, leveling, drying, and firing the titanium oxide paste as described above was performed once to thereby form first porous layer 6 made of titanium oxide and having a total thickness of 7 μm.

(Formation of Intermediate Layer)

Next, particles (manufactured by C.I. Kasei Co., Ltd.) made of zirconium oxide and having an average particle diameter of 100 nm were dispersed in terpineol to obtain a dispersed liquid, and ethyl cellulose was mixed with this dispersed liquid, thereby preparing a paste. The weight ratio among the zirconium oxide particles, terpineol and ethyl cellulose was 65:30:5.

Next, using the screen printing machine (model: LS-34TVA (manufactured by Newlong Seimitsu Kogyo CO., Ltd.)) including a screen plate having an opening of 6 mm in width×54 mm in length, the obtained paste was applied onto first porous layer 6. Here, the applied paste was leveled at a room temperature for one hour, was preliminarily dried at 80° C. for 20 minutes, and was fired at 450° C. for one hour. Intermediate layer 4a made of zirconium oxide and having a thickness of 7 μm was thus formed.

(Formation of Second Porous Layer)

Next, using the screen printing machine (model: LS-34TVA (manufactured by Newlong Seimitsu Kogyo CO., Ltd.)) including a screen plate having an opening of 5 mm in width×50 mm in length, a titanium oxide paste (product name: PST-400C (manufactured by Nikki Catalysts and Chemicals Ltd.)) with titanium oxide having an average particle diameter of 400 nm dispersed therein was applied onto intermediate layer 4a.

Then, the titanium oxide paste was leveled at a room temperature for one hour, was preliminarily dried at 80° C. for 20 minutes, and was further fired at 450° C. for one hour. Each step of applying, leveling, drying, and firing the titanium oxide paste as described above was performed once to thereby form second porous layer 11 made of titanium oxide and having a thickness of 7 μm. The porous electrode according to Example 1 was thus fabricated. This porous electrode had a total thickness of 21 μm. Using a method similar to the above, ten porous electrodes according to Example 1 were fabricated.

The light transmittance of the porous electrode according to Example 1 was 15% when the wavelength of light was 550 nm. As a result of measurement of the transport resistance of an electrolytic solution with an impedance analyzer (manufactured by Auto lab Co.), the transport resistance of the electrolytic solution was 2.1Ω.

Comparative Example 1

In Comparative Example 1, an attempt was made to fabricate ten porous electrodes according to Comparative Example 1 shown in FIG. 6 using a method similar to that of Example 1 except that the second porous layer was formed before formation of the intermediate layer in the steps in Example 1. However, nine out of ten could not be fabricated, and only one porous electrode could be formed.

As shown in FIG. 6, the porous electrode according to Comparative Example 1 has a first porous layer 206, a second porous layer 211 and an intermediate layer 204 formed on a substrate 201 in this order. The light transmittance was 16% when the wavelength of light was 550 nm. As a result of measurement of the transport resistance of the electrolytic solution with the impedance analyzer (manufactured by Auto lab Co.), the transport resistance of the electrolytic solution was 2.2Ω.

The above results have revealed that, according to the present invention, the porous electrode having performance equivalent to the light transmittance and transport resistance of a conventional porous electrode can be fabricated with good yield.

Example 2

In Example 2, dye-sensitized solar cell 10 shown in FIG. 2 was fabricated. FIG. 2 is a schematic cross-sectional view showing an example of a dye-sensitized solar cell fabricated in accordance with the present example.

(Preparation of Conductive Substrate)

Conductive substrate 12 (glass with an $SnO_2$ film (manufactured by Nippon Sheet Glass Co., Ltd.)) with substrate conductive layer 2 made of the $SnO_2$ film formed on substrate 1 made of glass having outer dimensions of 15 mm in width×70 mm in length×4 mm in thickness was prepared.

(Cutting of Substrate Conductive Layer)

Above-mentioned conductive substrate 12 was introduced into a laser device (YAG laser (manufactured by Seishin Trading Co., Ltd.)) emitting laser light having a basic wavelength of 1.06 μm. Then, conductive substrate 12 was irradiated with laser light in the form of stripe, and the $SnO_2$ film was partially evaporated. One scribe line 13 having a width of 0.1 mm was thus formed.

(Formation of First Porous Layer)

Then, above-described conductive substrate 12 was disposed on the screen printing machine (model: LS-34TVA (manufactured by Newlong Seimitsu Kogyo CO., Ltd.)) including a screen plate having an opening of 5 mm×50 mm, and the titanium oxide paste (product name: Ti-Nanoxide D/SP (manufactured by Solaronix)) with titanium oxide having an average particle diameter of 13 nm dispersed therein was applied onto the surface of conductive substrate 12. This titanium oxide included more than or equal to 90% of the anatase-type crystal structure. This crystal structure was obtained by measurement with the X-ray diffractometer (XRD).

Then, the above-described titanium oxide paste was leveled at a room temperature for one hour, was preliminarily dried at 80° C. for 20 minutes, and was fired at 450° C. for one hour. Each step of applying, leveling, drying, and firing the titanium oxide paste as described above was performed five times to thereby form first porous layer 6 made of titanium oxide and having a total thickness of 30 μm.

(Formation of Porous Insulating Layer)

Next, particles (manufactured by C.I. Kasei Co., Ltd.) made of zirconium oxide and having an average particle diameter of 100 nm were dispersed in terpineol to obtain a dispersed liquid, and ethyl cellulose was mixed with this dispersed liquid, thereby preparing a paste. The weight ratio among the zirconium oxide particles, terpineol and ethyl cellulose in this paste was 65:30:5.

Next, using the screen printing machine (model: LS-34TVA (manufactured by Newlong Seimitsu Kogyo CO., Ltd.)) including a screen plate having an opening of 6 mm in width×54 mm in length, the obtained paste was applied onto first porous layer 6. The applied paste was leveled at a room temperature for one hour, was preliminarily dried at 80° C. for 20 minutes, and was fired at 450° C. for one hour. Porous insulating layer 4 made of zirconium oxide and having a thickness of 5 μm was thus formed.

(Formation of Second Porous Layer)

Next, using the screen printing machine (model: LS-34TVA (manufactured by Newlong Seimitsu Kogyo CO., Ltd.)) including a screen plate having an opening of 5 mm in width×50 mm in length, a titanium oxide paste (product name: PST-400C (manufactured by Nikki Catalysts and Chemicals Ltd.)) with titanium oxide having an average particle diameter of 400 nm dispersed therein was applied onto porous insulating layer 4.

Then, the titanium oxide paste was leveled at a room temperature for one hour, was preliminarily dried at 80° C. for 20 minutes, and was further fired at 450° C. for one hour. Each step of applying, leveling, drying, and firing the titanium oxide paste as described above was performed two times to thereby form second porous layer 11 made of titanium oxide and having a total thickness of 12 μm.

(Formation of Catalytic Layer)

Next, using the screen printing machine (model: LS-34TVA (manufactured by Newlong Seimitsu Kogyo CO., Ltd.)) including a screen plate having an opening of 5 mm in width×50 mm in length, a catalytic layer formation material (product name: Pt-Catalyst T/SP (manufactured by Solaronix)) was applied onto second porous layer 11, and the obtained film was fired at 450° C. for one hour to thereby form cluster-like catalytic layer 3.

(Formation of Conductive Layer)

Next, a metal mask having an opening of 6.2 mm in width×52 mm in length was prepared, titanium was formed on porous insulating layer 4 at a vapor deposition rate of 5 Å/S using an electron beam vapor deposition device (model: ei-5 (manufactured by ULVAC Inc.)). Conductive layer 5 having a thickness of about 500 nm was thereby formed (hereinafter, the stacked components from first porous layer 6 to conductive layer 5 will also be simply referred to as a "stacked body").

(Adsorption of Sensitized Dye)

A ruthenium-based metal complex dye (product name: Ruthenium620-1H3TBA (manufactured by Solaronix)) serving as the sensitized dye was dissolved in a concentration of $4 \times 10^{-4}$ mol/l in a solvent obtained by mixing acetonitrile (manufactured by Aldrich Chemical Company) and t-butyl alcohol (manufactured by Aldrich Chemical Company) at a volume ratio of 1:1. A dye adsorption solution was thus obtained.

The obtained stacked body was immersed in the above-described dye adsorption solution at 40° C. for 20 hours to cause the sensitized dye to adsorb on first porous layer 6. Thereafter, the above-described stacked body was cleaned with ethanol (manufactured by Aldrich Chemical Company), and then was dried at about 80° C. for about 10 minutes.

(Formation of Sealing Member)

Next, an ultraviolet curing agent (model No.: 31X-101 (manufactured by ThreeBond Co., Ltd.)) was applied between a peripheral portion of substrate conductive layer 2 (i.e., a portion where first porous layer 6 was not formed) and a region where the dye-sensitized solar cell was to be formed, and translucent cover member 9 (manufactured by Asahi Glass Co., Ltd.) of 10 mm in width×70 mm in length×4.0 mm in thickness and conductive substrate 12 were affixed together with this ultraviolet curing agent interposed therebetween.

Next, using an ultraviolet irradiation lamp (product name: Novacure (manufactured by EFD), the portion to which the ultraviolet curing agent had been applied was irradiated with ultraviolet light to cure the ultraviolet curing agent. Sealing member 8 was thus formed, and conductive substrate 12 and translucent cover member 9 were fixed.

(Preparation of Electrolyte)

An electrolyte was prepared by dissolving, as redox species contained in the electrolyte, LiI (manufactured by Aldrich Chemical Company) in a concentration of 0.1 mol/l and iodine $I_2$ (manufactured by Tokyo Chemical Industry Co., Ltd.) in a concentration of 0.01 mol/l in an acetonitrile solvent, and by dissolving, as additives contained in the electrolyte, t-butyl pyridine (TBP (manufactured by Aldrich Chemical Company) in a concentration of 0.5 mol/l and dimethylpropylimidazole iodide (DMPII (manufactured by Shikoku Chemicals Corporation)) in a concentration of 0.6 mol/l.

(Injection of Electrolyte)

Substrate 1 used in the present example had an electrolyte injection hole provided in advance. The electrolyte was injected through the electrolyte injection hole of substrate 1, so that first porous layer 6, porous insulating layer 4 and second porous layer 11 contained the electrolyte. Thereafter, the electrolyte injection hole provided in substrate 1 was sealed with resin. Dye-sensitized solar cell 10 shown in FIG. 2 was thus completed.

A dye-sensitized solar cell module was fabricated in Examples 3 to 5 described below.

Example 3

In Example 3, dye-sensitized solar cell module 20 in which six dye-sensitized solar cells as shown in FIG. 3 were connected in series was fabricated by using a method similar to that of Example 2.

(Preparation of Conductive Substrate)

Conductive substrate 12 (glass with an $SnO_2$ film (manufactured by Nippon Sheet Glass Co., Ltd.)) with substrate conductive layer 2 made of the $SnO_2$ film formed on substrate 1 made of glass having outer dimensions of 70 mm in width×70 mm in length×4 mm in thickness was prepared.

(Cutting of Substrate Conductive Layer)

Above-mentioned conductive substrate 12 was introduced into a laser device (YAG laser (manufactured by Seishin Trading Co., Ltd.)) emitting laser light having a basic wavelength of 1.06 μM. Then, conductive substrate 12 was irradiated with laser light in the form of stripe, and the $SnO_2$ film was partially evaporated. Six scribe lines 13 each having a width of 0.1 mm was thus formed at a spacing of 6 mm.

(Formation of First Porous Layer)

Then, above-described conductive substrate 12 was disposed on the screen printing machine (model: LS-34TVA (manufactured by Newlong Seimitsu Kogyo CO., Ltd.)) including a screen plate having seven openings of 5 mm×50 mm, and the titanium oxide paste (product name: Ti-Nanoxide D/SP (manufactured by Solaronix)) with titanium oxide having an average particle diameter of 13 nm dispersed therein was applied onto the surface of conductive substrate 12. This titanium oxide included more than or equal to 90% of the anatase-type crystal structure. This crystal structure was obtained by measurement with the X-ray diffractometer (XRD).

Then, the above-described titanium oxide paste was leveled at a room temperature for one hour, was preliminarily dried at 80° C. for 20 minutes, and was fired at 450° C. for one hour. Each step of applying, leveling, drying, and firing the titanium oxide paste as described above was performed five times to thereby form first porous layer 6 made of titanium oxide and having a total thickness of 30 μm.

(Formation of Porous Insulating Layer)

Next, particles (manufactured by C.I. Kasei Co., Ltd.) made of zirconium oxide and having an average particle diameter of 100 nm were dispersed in terpineol to obtain a dispersed liquid, and ethyl cellulose was mixed with this dispersed liquid, thereby preparing a paste. The weight ratio among the zirconium oxide particles, terpineol and ethyl cellulose in this paste was 65:30:5.

Next, using the screen printing machine (model: LS-34TVA (manufactured by Newlong Seimitsu Kogyo CO., Ltd.)) including a screen plate having seven openings of 6 mm in width×54 mm in length, the obtained paste was applied onto first porous layer 6. The applied paste was leveled at a room temperature for one hour, was preliminarily dried at 80° C. for 20 minutes, and was fired at 450° C. for one hour. Porous insulating layer 4 made of zirconium oxide and having a thickness of 5 μm was thus formed.

(Formation of Second Porous Layer)

Next, using the screen printing machine (model: LS-34TVA (manufactured by Newlong Seimitsu Kogyo CO., Ltd.)) including a screen plate having seven openings of 5 mm in width×50 mm in length, a titanium oxide paste (product name: PST-400C (manufactured by Nikki Catalysts and Chemicals Ltd.)) with titanium oxide having an average particle diameter of 400 nm dispersed therein was applied onto porous insulating layer 4.

Then, the titanium oxide paste was leveled at a room temperature for one hour, was preliminarily dried at 80° C. for 20 minutes, and was further fired at 450° C. for one hour. Each step of applying, leveling, drying, and firing the titanium oxide paste as described above was performed two times to thereby form second porous layer 11 made of titanium oxide and having a total thickness of 12 μm.

(Formation of Catalytic Layer)

Next, using the screen printing machine (model: LS-34TVA (manufactured by Newlong Seimitsu Kogyo CO., Ltd.)) including a screen plate having seven openings of 5 mm in width×50 mm in length, a catalytic layer formation material (product name: Pt-Catalyst T/SP (manufactured by Solaronix)) was applied onto second porous layer 11, and the obtained film was fired at 450° C. for one hour to thereby form cluster-like catalytic layer 3.

(Formation of Conductive Layer)

Next, a metal mask having seven openings of 6.2 mm in width×52 mm in length was prepared, and titanium was formed on porous insulating layer 4 at a vapor deposition rate of 5 Å/S using the electron beam vapor deposition device (model: ei-5 (manufactured by ULVAC Inc.)). Conductive layer 5 having a thickness of about 500 nm was thereby formed. Hereinafter, the stacked components from first porous layer 6 to conductive layer 5 will also be simply referred to as a "stacked body."

(Adsorption of Sensitized Dye)

The obtained stacked body was immersed in the dye adsorption solution obtained by a method similar to that of Example 2 at 40° C. for 20 hours to cause the sensitized dye to adsorb on first porous layer 6. Thereafter, the above-described stacked body was cleaned with ethanol (manufactured by Aldrich Chemical Company), and then was dried at about 80° C. for about 10 minutes.

(Formation of Sealing Member)

Next, an ultraviolet curing agent (model No.: 31X-101 (manufactured by ThreeBond Co., Ltd.)) was applied between a peripheral portion of substrate conductive layer 2 (i.e., a portion where first porous layer 6 was not formed) and a region where the dye-sensitized solar cell was to be formed, and translucent cover member 9 (manufactured by Asahi Glass Co., Ltd.) of 50 mm in width×70 mm in length×4.0 mm in thickness and conductive substrate 12 were affixed together with this ultraviolet curing agent interposed therebetween.

Next, using an ultraviolet irradiation lamp (product name: Novacure (manufactured by EFD), the portion to which the ultraviolet curing agent had been applied was irradiated with ultraviolet light to cure the ultraviolet curing agent. Sealing member 8 was thus formed, and conductive substrate 12 and translucent cover member 9 were fixed.

(Injection of Electrolyte)

Substrate 1 used in the present example had an electrolyte injection hole provided in advance. The electrolyte prepared in Example 2 was injected through the electrolyte injection hole of substrate 1, and first porous layer 6, porous insulating layer 4 and second porous layer 11 thereby contained the electrolyte. Thereafter, the electrolyte injection hole provided in substrate 1 was sealed with resin. Dye-sensitized solar cell module 20 shown in FIG. 3 was thus completed.

Example 4

A dye-sensitized solar cell module according to Example 4 was fabricated by steps similar to those of Example 3 except that the order of forming catalytic layer 3 and conductive layer 5 was reversed in the method for manufacturing the dye-sensitized solar cell module according to Example 3.

Example 5

A dye-sensitized solar cell module according to Example 5 was fabricated by steps similar to those of Example 4 except that pores were formed in conductive layer 5 after formation of conductive layer 5 in the method for manufacturing the dye-sensitized solar cell module according to Example 4.

In the dye-sensitized solar cell according to Example 5, conductive layer 5 was irradiated with laser light at adjusted current value and frequency using the laser device (YAG laser (manufactured by Seishin Trading Co., Ltd.)) emitting laser light having a basic wavelength of 1.06 μm, and small holes having a hole diameter of 40 μm were thereby formed in conductive layer 5 at a spacing of 1 μm.

Comparative Example 2

As a dye-sensitized solar cell module 120 according to Comparative Example 2, a dye-sensitized solar cell module shown in FIG. 5 was fabricated similarly to Example 3 except that the order of forming second porous layer 11 and porous insulating layer 4 was reversed. Since the first porous layer and the second porous layer are continuously formed using the same material, FIG. 4 does not show a boundary between the first porous layer and the second porous layer, and it is also regarded substantially as one that only includes first porous layer 106.

In addition, the dye-sensitized solar cell module in FIG. 5 is configured by serially connecting six dye-sensitized solar cells shown in FIG. 4. It is to be noted that in FIGS. 4 and 5, components corresponding to the components of the dye-sensitized solar cell in FIG. 2 are denoted by numerical values with 100 added to the numerical values in FIG. 2.

The dye-sensitized solar cell modules obtained in Examples 3 to 5 and Comparative Example 2 were irradiated with light having an intensity of 1 kW/m² (AM1.5 solar simulator) to measure various properties of the dye-sensitized solar cell modules, that is, short-circuit current (unit: $J_{sc}$), open voltage (unit: $V_{oc}(V)$), fill factor (FF), and conversion efficiency (unit: %). The following table 1 shows the results obtained by this measurement.

TABLE 1

| | Short-Circuit Current Jsc (mA/cm²) | Open Voltage Voc (V) | Fill Factor FF | Conversion Efficiency (%) |
| --- | --- | --- | --- | --- |
| Example 3 | 1.66 | 4.77 | 0.66 | 5.22 |
| Example 4 | 1.54 | 4.78 | 0.68 | 5.00 |
| Example 5 | 1.72 | 4.99 | 0.69 | 5.92 |
| Comparative Example 2 | 1.44 | 3.99 | 0.43 | 2.47 |

In the dye-sensitized solar cell modules according to Examples 3 to 5, stripping was not seen between first porous layer 6 and porous insulating layer 4, and excellent photoelectric conversion characteristics could be obtained. On the other hand, in the dye-sensitized solar cell module according to Comparative Example 2, stripping was seen between first porous layer 106 and porous insulating layer 104, and it has been revealed that various properties are significantly lower than those of the dye-sensitized solar cell modules according to Examples 3 to 5.

This result has revealed that, by providing first porous layer 6, porous insulating layer 4 and second porous layer 11 in this order in the structure of the dye-sensitized solar cell, stripping between first porous layer 106 and porous insulating layer 104 can be prevented, so that a reduction in various properties of the dye-sensitized solar cell can be suppressed.

As described above, the embodiments and the examples of the present invention have been described. It is also expected from the beginning that the structures of the embodiments and the examples described above are combined as appropriate.

It should be understood that the embodiments and the examples disclosed herein are illustrative and not limitative in any respect. The scope of the present invention is defined by the terms of the claims, rather than the description of the embodiments above, and is intended to include any modifications within the scope and meaning equivalent to the terms of the claims.

INDUSTRIAL APPLICABILITY

The dye-sensitized solar cell according to the present invention is used for a residential solar cell system, a system of an electric power plant and the like.

REFERENCE SIGNS LIST 1, 201 substrate; 2 substrate conductive layer; 3, 103 catalytic layer; 4, 104 porous insulating layer; 4a, 204 intermediate layer; 5, 105 conductive layer; 6, 106, 206 first porous layer; 8, 108 sealing member; 9 translucent cover member; 10, 110 dye-sensitized solar cell; 11, 211 second porous layer; 12 conductive substrate; 13 scribe line; 20, 120 dye-sensitized solar cell module; 30, 130 arrow; 101 glass substrate; 102 transparent conductive layer; 109 cover member

The invention claimed is:

1. A dye-sensitized solar cell, comprising:
a substrate;
a first conductive layer provided on said substrate;
a second conductive layer provided on said substrate and separated from said first conductive layer;
a first porous layer provided on said first conductive layer, said first porous layer having at least a sensitizing dye adsorbed thereon and containing a electrolyte therein;
a porous insulating layer provided on said first porous layer, on at least a side surface of said first porous layer and on a surface of said substrate between said first conductive layer and said second conductive layer, said porous insulating layer containing an electrolyte therein and comprising particles of a material different from a material of the first porous layer;
a second porous layer provided on said porous insulating layer, said second porous layer containing an electrolyte therein and comprising particles of the same material as the first porous layer;
a catalytic layer provided on said second porous layer; and
a third conductive layer provided on said catalytic layer and connected to said second conductive layer,
wherein the particles comprising said first porous layer have an average particle diameter of 5 nm to 50 nm,
the particles comprising said second porous layer have an average particle diameter of 100 nm to 500 nm,
said porous insulating layer is provided to electrically insulate said first porous layer from said catalytic layer, and
a plurality of pores are formed in said third conductive layer, and said pores in said third conductive layer have a size of 0.1 μm to 100 μm.

2. The dye-sensitized solar cell according to claim 1, wherein a spacing between different pores in said third conductive layer is 1 μm to 300 μm.

3. The dye-sensitized solar cell according to claim 1, wherein a thickness of said first porous layer is 0.1 μm to 100 μm.

4. The dye-sensitized solar cell according to claim 1, wherein an average particle diameter of said particles comprising said porous insulating layer is smaller than an average particle diameter of said particles comprising said second porous layer.

5. The dye-sensitized solar cell according to claim 1, wherein an average particle diameter of said particles comprising said porous insulating layer is 5 nm to 400 nm.

6. The dye-sensitized solar cell according to claim 1, wherein an average particle diameter of said particles comprising said porous insulating layer is 10 nm to 100 nm.

7. The dye-sensitized solar cell according to claim 1, wherein both the first porous layer and the second porous layer comprise titanium oxide having more than or equal to 80% anatase-type crystal structure.

8. The dye-sensitized solar cell according to claim 1, wherein the particles constituting said second porous layer are larger in average particle diameter than the particles constituting said porous insulating layer.

9. The dye-sensitized solar cell according to claim 1, wherein said particles constituting said first porous layer, said second porous layer and said porous insulating layer comprise metal oxide.

10. The dye-sensitized solar cell according to claim 1, wherein
    both of said first porous layer and said second porous layer comprise titanium oxide, and
    said porous insulating layer comprises one or more metal oxides selected from the group consisting of zirconium oxide, silicon oxide and aluminum oxide, or a mixture containing one or more of said metal oxides.

11. The dye-sensitized solar cell according to claim 1, wherein said third conductive layer comprises a metal material or a metal oxide material.

12. The dye-sensitized solar cell according to claim 11, wherein said metal material comprises one or more materials selected from the group consisting of titanium, nickel and tantalum.

13. The dye-sensitized solar cell according to claim 11, wherein said metal oxide material comprises one or more materials selected from the group consisting of indium tin composite oxide (ITO), tin oxide (SnO$_2$), fluorine-doped tin oxide (FTO), zinc oxide (ZnO), and indium oxide.

* * * * *